United States Patent
Yoo et al.

(10) Patent No.: US 7,034,989 B2
(45) Date of Patent: Apr. 25, 2006

(54) OPTICAL WAVELENGTH CONVERSION APPARATUS AND METHOD USING INJECTION LOCKING OF FABRY-PEROT LASER DIODE

(75) Inventors: Hark Yoo, Seoul (KR); Hyuek Jae Lee, Daejeon (KR); Yong Deok Jeong, Chungcheongbuk-do (KR); Yong Hyub Won, Daejeon (KR); Min Ho Kang, Seoul (KR)

(73) Assignees: Information and Communications University Educational Foundation, Seoul (KR); Samsung Electronics Co., Ltd., Gyeonggi-Do (KR)

( * ) Notice: Subject to any disclaimer, the term of this patent is extended or adjusted under 35 U.S.C. 154(b) by 153 days.

(21) Appl. No.: 10/833,832

(22) Filed: Apr. 28, 2004

(65) Prior Publication Data
US 2005/0100267 A1    May 12, 2005

(30) Foreign Application Priority Data
Nov. 11, 2003    (KR) ...................... 10-2003-0079380

(51) Int. Cl.
*G02F 2/02*      (2006.01)
*G02F 1/35*      (2006.01)
(52) U.S. Cl. .................................. 359/326
(58) Field of Classification Search ............... 359/326
See application file for complete search history.

(56) References Cited

U.S. PATENT DOCUMENTS

| | | | |
|---|---|---|---|
| 5,940,207 A * | 8/1999 | Weich et al. ............... | 359/333 |
| 6,101,027 A * | 8/2000 | Lee et al. .................. | 359/344 |
| 6,819,476 B1 * | 11/2004 | Hunt ......................... | 359/326 |
| 2004/0184491 A1 * | 9/2004 | Wai et al. .................. | 372/27 |
| 2005/0094146 A1 * | 5/2005 | Hunt ......................... | 356/401 |

OTHER PUBLICATIONS

Chow et al. ("All-optical Format and Wavelength Conversion using Polarization Switching in a FP Laser Diode", 2002 IEEE, pp. 629-630).*
Chow et al. RZ to NRZ Data Format and Wavelength Conversion using an Injection Locked Laser Diode, 2003 IEEE, pp. 475-476).*

(Continued)

*Primary Examiner*—Michelle Connelly-Cushwa
(74) *Attorney, Agent, or Firm*—Gifford, Krass, Groh, Sprinkle, Anderson & Citkowski, P.C.

(57) ABSTRACT

Disclosed are an apparatus and method for converting the wavelength of an optical signal using a multi-mode Fabry-Perot laser diode. The apparatus controls polarization of an external pump optical signal to output a TE polarized pump optical signal, and controls polarization of a probe optical signal to output a TM polarized probe optical signal. The apparatus couples the TM polarized probe optical signal and TE polarized pump optical signal irrespective of the polarization of the optical signals. The apparatus finely controls the polarization of the pump optical signal and the polarization of the probe optical signal such that they conform to TE and TM modes of the Fabry-Perot laser diode, respectively. The Fabry-Perot laser diode injection-locks the TE polarized pump optical signal of the coupled signal to change the position of a TM mode absorption null (a point at which an output optical signal has the minimum intensity), to thereby convert the wavelength of the TE polarized pump optical signal to the wavelength of the TM polarized probe optical signal. Accordingly, a wide wavelength conversion band is provided, and inverting and non-inverting wavelength conversions are easily carried out.

8 Claims, 3 Drawing Sheets

OTHER PUBLICATIONS

Chow et al. ("All-optical RZ to NRZ data format and wavelength conversion using an injection locked laser", Optics Communications, 2003, vol. 223, pp. 309-313).*

Chow et al. ("All-optical NRZ to RZ format and wavelength converter by dual-wavelength injection locking", Optics Communications, 2003, vol. 209, pp. 329-334).*

Yoo et al. ("All-Optical Wavelength Conversion Using Absorption Modulation of an Injection-Locked Fabry-Perot Laser Diode", IEEE Photonics Technology Letters, vol. 16, No. 2, Feb. 2004, pp. 536-538).*

"Experimental characterization of dual-wavelength injection-locking of a Fabry-Perot laser diode", H.K. Tsang et al., Optics Communications 156, Nov. 15, 1998, 321-326.

"All-Optical Wavelength Conversion: Technologies and Applications in DWDM Networks", Jaafar M.H. Elmirghani et al., IEEE Communications Magazine, Mar. 2000, 86-92.

"All-Optical Wavelength Conversion by Semiconductor Optical Amplifiers", Durhuus et al., ournal of Lightwave Technology, vol. 14, No. 6, Jun. 1996, 942-954.

"Simultaneous Repolarization of Two 10-Gb/s Polarization-Scrambled Wavelength Channels Using a Mutual-Injection-Locked Laser Diode", L.Y Chan et al., IEEE Photonics Technology Letters, vol. 14, No. 12, Dec. 2002, 1740-1742.

"All-optical Format and Wavelength Conversion using Polarization Switching in a FP Laser Diode", C.W. Chow et al., IEEE, 629-630.

"Large Signal Analysis of All-Optical Wavelength Conversion Using Two-Mode Injection-Locking in Semiconductor Lasers", Horer et al., IEEE Journal of Quantum Electronics, vol. 33, No. 4, Apr. 1997, 596-608.

* cited by examiner

OPTICAL WAVELENGTH CONVERSION APPARATUS AND METHOD USING INJECTION LOCKING OF FABRY-PEROT LASER DIODE

CROSS REFERENCE TO RELATED APPLICATION

This application claims priority to and the benefit of Korea Patent Application No. 2003-79380 filed on Nov. 11, 2003 in the Korean Intellectual Property Office, the entire content of which is incorporated herein by reference.

BACKGROUND OF THE INVENTION (a) Field of the Invention

The present invention relates to an optical wavelength conversion apparatus and method. More specifically, the present invention relates to an apparatus and method for converting the wavelength of an optical signal using the injection locking of a Fabry-Perot laser diode.

(b) Description of the Related Art

An electrical wavelength conversion method, one of optical wavelength conversion techniques, converts an optical signal to an electric signal and transmits the electric signal to an optical transmitter with a different wavelength. This method has problems that there is a limit in the operating speed of an electronic device, and O/E/O conversion increases the cost.

Accordingly, a variety of all-optical wavelength conversion techniques that optically convert the wavelengths of optical signals without converting them to electric signals have been being studied. One of the techniques is cross gain modulation using a gain saturation characteristic of a semiconductor optical amplifier (referred to as SOA hereinafter). This technique provides a simple configuration and relatively stable operation characteristics. However, it requires a high input power, deteriorates the extinction ratio of an output optical signal, and increases the cost due to the expensive SOA.

Another all-optical wavelength conversion method is a cross phase modulation technique using a phase modulation difference according to a gain difference of SOAs. This technique provides a high extinction ratio because an output signal is digitally modulated on the basis of a variation of 180° of phase. However, the cross phase modulation technique requires an interferometer system to obtain cross phase modulation and needs accurate design and control for the purpose of attaining a correct phase difference.

Another all-optical wavelength conversion technique uses four-wave mixing that is a non-linear characteristic in the SOA. This is independent on a bit rate or format of an input optical signal, and enables multi-channel wavelength conversion because it uses the four-wave mixing. However, this technique uses the non-linear effect so that conversion efficiency is low. To solve this problem, the technique requires very high input optical power of more than several mW.

Recently, optical wavelength conversion that injection-locks probe and pump optical signals in an inexpensive Fabry-Perot laser diode to convert the wavelength of optical signals has been proposed. In this technique, a continuous wave optical signal (probe optical signal) is injection-locked in a specific mode of the Fabry-Perot laser diode, and an input optical signal (pump optical signal) is input to injection-lock the Fabry-Perot laser diode in another mode. When the pump optical signal is 1, the refractive index of the Fabry-Perot laser diode is changed so that modes in the Fabry-Perot laser diode are red shifted. Here, the injection locking of the probe optical signal is cancelled and its gain is lost. On the other hand, when the pump optical signal is 0, the modes are returned to their original positions so that the probe optical signal is injection-locked again and obtains a gain. In this manner, data of the pump optical signal are transferred in an inverted form to the probe optical signal. Accordingly, this method can be considered as a cross gain modulation technique that modulates the gain the probe optical signal obtains by the injection locking through an input optical signal (pump optical signal).

However, the injection locking can occurs only in the modes that obtain gains in a gain spectrum of the Fabry-Perot laser diode. Thus, a range of wavelength conversion is restricted by the gain spectrum of the Fabry-Perot laser diode.

Furthermore, in the case of non-inverting wavelength conversion, the probe optical signal and pump optical signal should be simultaneously injection-locked in two specific modes of the Fabry-Perot laser diode when the pump optical signal is 1, and then the injection locking is simultaneously cancelled when the pump optical signal is 0. However, the non-inverting wavelength conversion is very difficult to carry out because the probe optical signal has a characteristic that the injection locking of the probe signal is not cancelled even if the pump optical signal becomes 0 and the injection locking of the pump optical signal is cancelled.

SUMMARY OF THE INVENTION

It is an advantage of the present invention to provide an optical wavelength conversion apparatus and method using the injection locking of a Fabry-Perot laser diode, which varies a central wavelength of an absorption null that is a characteristic of the FP-LD for a TM polarized probe optical signal to provide a wide wavelength conversion band and easily carry out inverting and non-inverting wavelength conversion.

To accomplish the advantage of the present invention, there is provided an optical wavelength converter using the injection locking of a Fabry-Perot laser diode, which converts the wavelength of an optical signal received from the outside, comprising a first polarization controller that controls polarization of a pump optical signal to output a TE polarized pump optical signal; a second polarization controller that controls polarization of a probe optical signal to output a TM polarized probe optical signal; a photo-coupler that couples the TM polarized probe optical signal and TE polarized pump optical signal; a Fabry-Perot laser diode that injection-locks the TE polarized pump optical signal of the coupled signal to change the position of a TM mode absorption null (a point at which an output optical signal has the minimum intensity), to thereby convert the wavelength of the TE polarized pump optical signal to the wavelength of the TM polarized probe optical signal; and a circulator that outputs the probe optical signal to the outside.

The apparatus further comprises a third polarization controller that controls the polarization of the pump optical signal and the polarization of the probe optical signal such that they conform to TE and TM modes of the Fabry-Perot laser diode, respectively.

To accomplish the advantage of the present invention, there is also provided an optical wavelength conversion method using the injection locking of a Fabry-Perot laser diode, which converts the wavelength of an optical signal received from the outside using a multi-mode Fabry-Perot laser diode, comprising (a) controlling polarization of a probe optical signal to output a TM polarized probe optical signal; (b) controlling polarization of a pump optical signal to output a TE polarized pump optical signal; (c) coupling the TM polarized probe optical signal and TE polarized pump optical signal; (d) injection-locking the TE polarized pump optical signal of the coupled signal to change the position of a TM mode absorption null (a point at which an output optical signal has the minimum intensity), to thereby convert the wavelength of the TE polarized pump optical signal to the wavelength of the TM polarized probe optical signal; and (e) outputting the probe optical signal to the outside.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
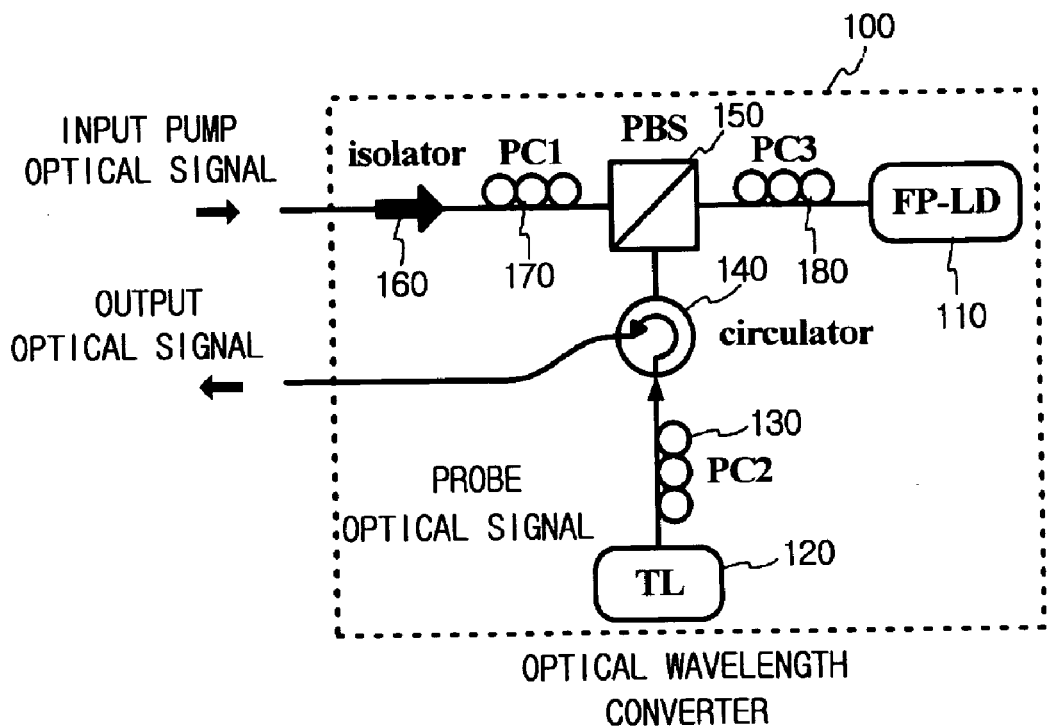
FIG. 1 shows the configuration of an optical wavelength converter using the injection locking of a Fabry-Perot laser diode according to an embodiment of the present invention.

FIG. 1 shows the configuration of an optical wavelength converter using the injection locking of a Fabry-Perot laser diode according to an embodiment of the present invention.

Referring to FIG. 1, the optical wavelength converter 100 using the injection locking of a Fabry-Perot laser diode includes a Fabry-Perot laser diode (referred to as FP-LD hereinafter) 110, a probe optical signal source 120, first, second, and third polarization controllers 170, 130, and 180, a circulator 140, a polarization beam splitter 150, and an isolator 160.

The FP-LD 110 has a multiple quantum well structure and includes a temperature controller (not shown) that controls the ambient temperature. The probe optical signal source 120 generates a probe optical signal with a fixed wavelength or a tunable wavelength according to fixed or tunable wavelength conversion.

Specifically, the probe optical signal source 120 generates the probe optical signal with a fixed or tunable wavelength, and the second polarization controller 130 controls polarization of the probe optical signal to output a TM (transverse magnetic) polarized probe optical signal. That is, the second polarization controller 130 controls the polarization of the received probe optical signal such that it conforms to the TM mode of the FP-LD 110.

The circulator 140 transmits the TM polarized probe optical signal to the polarization beam splitter 150 or sends an output optical signal (TM polarized output optical signal) that is output from the polarization beam splitter 150 to an output port (not shown). The isolator 160 prevents an external input pump optical signal from being input to devices other than the optical wavelength converter 100. The first polarization controller 170 controls polarization of the pump optical signal received from the isolator 160 to output a TE (transverse electric) polarized pump optical signal. That is, the first polarization controller 170 controls the polarization of the received pump optical signal such that it conforms to the TE mode of the FP-LD 110.

The polarization beam splitter (photo-coupler) 150 couples the pump optical signal and probe optical signal controlled by the first and second polarization controllers 170 and 130 irrespective of their polarization. Here, the polarization beam splitter 150 combines or separates the TE polarized pump optical signal and TM polarized probe optical signal with or from each other. The polarization beam splitter can be omitted if required when a separation loss of approximately 3 dB is permitted.

The third polarization controller 180 finely controls the polarization of the received pump optical signal and polarization of the received probe optical signal to conform them to the TE and TM modes of the FP-LD 110, respectively.

In the FP-LD 110, the interval between the TE and TM modes corresponds to the standard wavelength interval recommended by ITU_T. The FP-LD 110 adjusts positions of the modes using the temperature controller (not shown).

Figure 2:
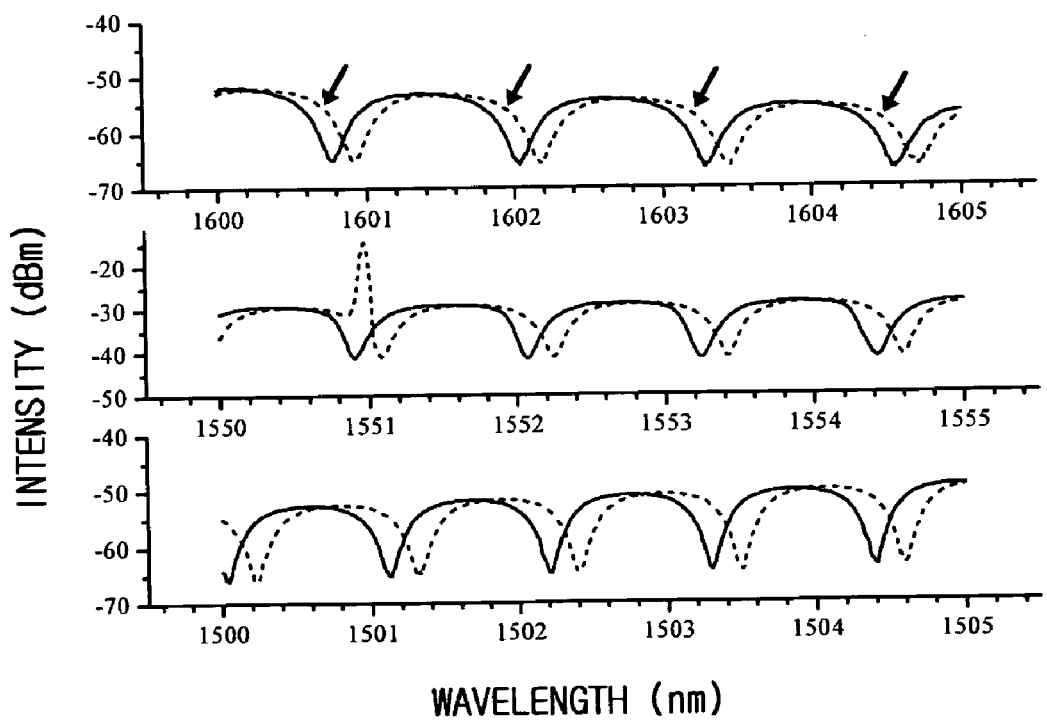
FIG. 2 shows reflection characteristic of the Fabry-Perot laser diode shown in FIG. 1.

The operation principle of the FP-LD 110 and the operation of the optical wavelength converter 100 using the same are described. FIG. 2 shows reflection characteristic of the FP-LD shown in FIG. 1.

When the probe optical signal source 120 generates the probe optical signal, the second polarization controller 130 controls the polarization of the probe optical signal input thereto such that it conforms to the TM mode of the FP-LD 110.

When the TM polarized probe optical signal is transmitted to the polarization beam splitter 150 through the circulator 140, the polarization beam splitter 150 transmits the received TM polarized probe optical signal to the FP-LD 110 via the third polarization controller 180.

FIG. 2 shows spectra of lights reflected by the FP-LD 110. As shown in FIG. 2, an absorption null (indicated by an arrow) is present at each TM mode position. The absorption null means a point at which the input probe optical signal is absorbed so that the output optical signal has the minimum intensity. It can be known from FIG. 2 that a spectrum region where the absorption nulls appear is not limited by the gain spectrum (approximately 20 nm) of the FP-LD but by the spectrum of ASE beam.

The first polarization controller 170 controls the polarization of the external pump optical signal input thereto such that it conforms to the TE mode of the FP-LD 110. The pump optical signal is input to the FP-LD 110 via the polarization beam splitter 150 and is injection-locked therein. Then, a refractive index of the FP-LD 110 is varied as represented by a solid line in FIG. 2. Accordingly, the absorption nulls of the TM mode are red shifted. That is, the positions of the absorption nulls of the TM mode are shifted according to the injection locking of the pump optical signal. This provides a wide wavelength conversion band, and enables non-inverting and inverting wavelength conversion.

A preferred embodiment of the optical wavelength converter using the above-described principle is described in detail below.

Figure 3:
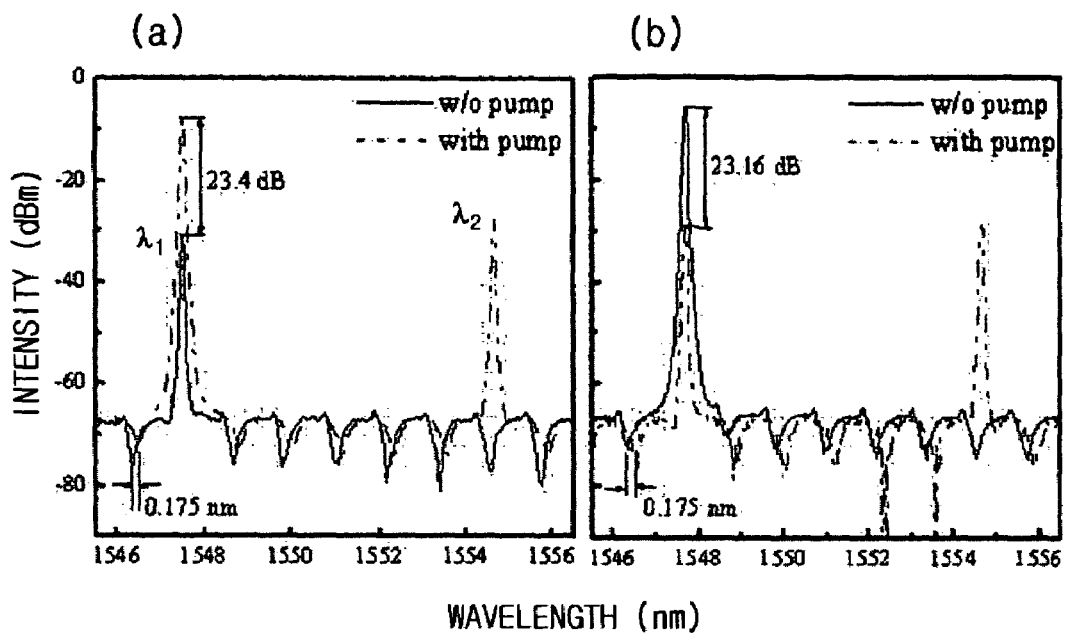
FIG. 3 is a spectrum characteristic diagram showing an optical wavelength conversion procedure according to the injection locking of a pump optical signal according to an embodiment of the present invention.

FIG. 3 is a spectrum characteristic diagram showing the optical wavelength conversion procedure according to the injection locking of the pump optical signal according to an embodiment of the present invention.

When the second polarization controller 130 controls the polarization of the probe optical signal having a wavelength $\lambda_1$ that requires conversion and outputs it, the temperature controller of the FP-LD 110 locates the TM polarized probe optical signal input to the FP-LD 110 at one of the absorption nulls. Subsequently, the first polarization controller 170 controls the polarization of the pump optical signal with a wavelength $\lambda_2$. The pump optical signal is then input to one of the TE modes of the FP-LD 110. Injection locking occurs based on the input optical signal power so that refractive index is varied. That is, the mode positions are red shifted, and simultaneously the absorption nulls of the TM mode are red shifted.

Accordingly, the probe optical signal input to the FP-LD 110 gets out of the absorption null so that its output power is improved as shown in FIG. 3(a). Consequently, non-inverting optical wavelength conversion is carried out from the pump optical signal with $\lambda_2$ to the continuous wave probe optical signal with $\lambda_1$.

When the TM polarized probe optical signal is initially located at a point red shifted from the absorption null such that long wavelength variation occurs, the probe optical signal enters the absorption null when the intensity of the pump optical signal increases. Consequently, inverting optical wavelength conversion occurs, as shown in FIG. 3(b).

As described above, the output intensity of the probe optical signal is varied by more than approximately 20 dB according to whether the pump optical signal is input to the FP-LD 110. That is, optical wavelength convention with high efficiency can be carried out.

An optical signal output through the output port is explained in detail with reference to the attached drawings.

Experimental conditions are described first. The FP-LD 100 has a multiple quantum well structure having a threshold current of 11 mA, and a mode interval of 1.16 nm. The FP-LD 110 is provided with current of 16 mA. As the pump optical signal, light having a wavelength of 1554.44 nm, emitted from a variable wavelength light generating source, is used. The light is modulated to a pseudo random binary sequence having a rate of 2.5 Gbps and a length of $2^{31}-1$ through an optical modulator. The optical power of the modulated pump optical signal before input to the wavelength converter 100 is −2.3 dBm.

Light having a wavelength of 1550.03 nm, generated by a tunable wavelength light generating source, is used as the probe optical signal. The optical power of the probe optical signal before input to the wavelength converter 100 is 6.7 dBm. In the case of inverting wavelength conversion, the wavelength of the probe optical signal is 1550.18 nm.

Figure 4:
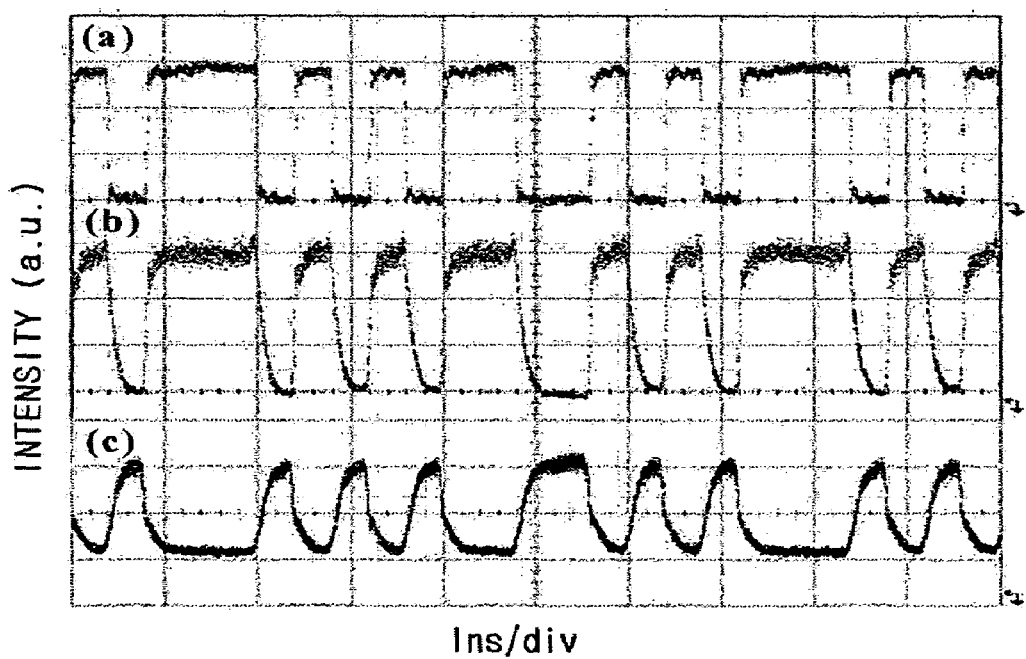
FIG. 4 shows results of measurement of output optical signals by an oscilloscope according to an embodiment of the present invention.

FIG. 4 shows results of measurement of output optical signals by an oscilloscope according to an embodiment of the present invention. These measurement results are obtained through experiments based on the above-described experimental conditions. FIG. 4(a) shows a measurement result of an optical signal of 2.5 Gbps input to the wavelength converter 100, and FIG. 4(b) shows a measurement results with respect to an output optical signal when the wavelength converter 100 carries out non-inverting wavelength conversion. FIG. 4(c) shows a measurement results of an output optical signal when the wavelength converter 100 executes inverting wavelength conversion. As shown in FIGS. 4(a), 4(b) and 4(c), there is a difference between the output optical signal forms according to non-inverting wavelength conversion and inverting wavelength conversion.

Figure 5:
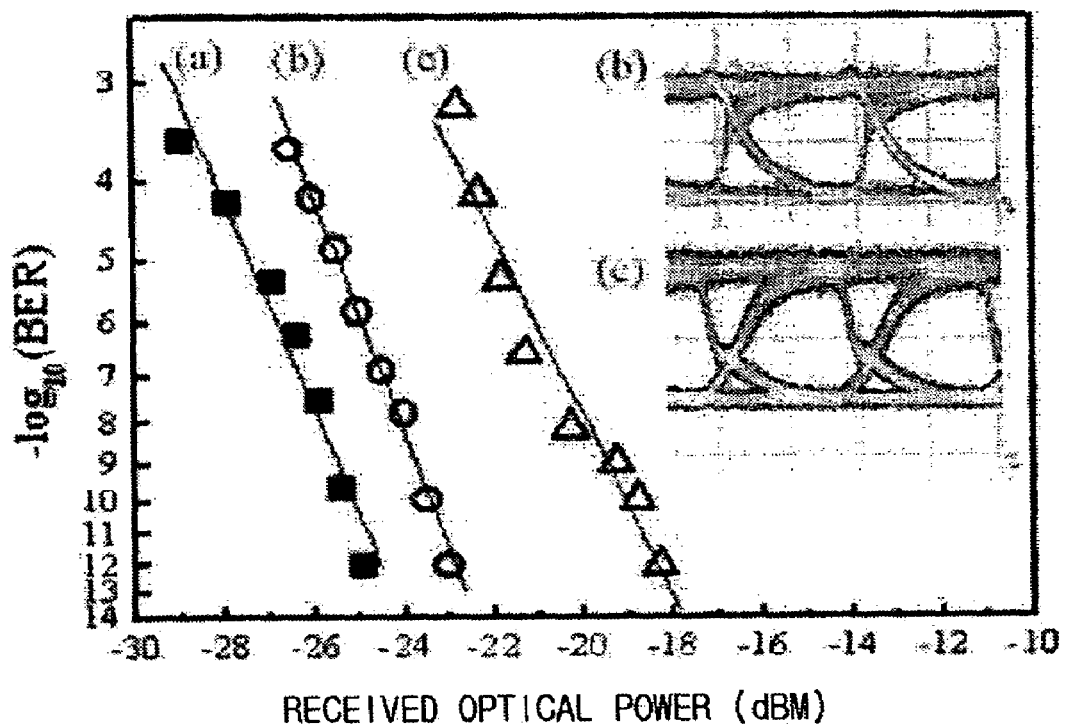
FIG. 5 shows results of measurement of bit error rates of optical signals obtained when wavelength conversion is carried out according to an embodiment of the present invention.

FIG. 5 shows results of measurement of bit error rates of optical signals, obtained when wavelength conversion is carried out according to an embodiment of the present invention. FIG. 5(a) shows a bit error rate of an input optical signal, and FIG. 5(b) shows a bit error rate of an output optical signal whose wavelength has been converted through non-inverting wavelength conversion. FIG. 5(c) shows a bit error rate of an output optical signal whose wavelength has been converted through inverting wavelength conversion. Eye patterns shown in FIG. 5 represent eye patterns of the output optical signals for the non-inverting and inverting wavelength conversion.

As shown in FIGS. 5(a), 5(b), and 5(c), when the input optical signal has the bit error rate of $10^{-9}$, power penalties of 2 dB and 6 dB were observed, respectively, for non-inverting and inverting wavelength conversion. It can be known from FIG. 5 that the optical wavelength converter of the present invention has excellent performance because an error floor is not observed until the bit error rate reaches $10^{-12}$.

Figure 6:
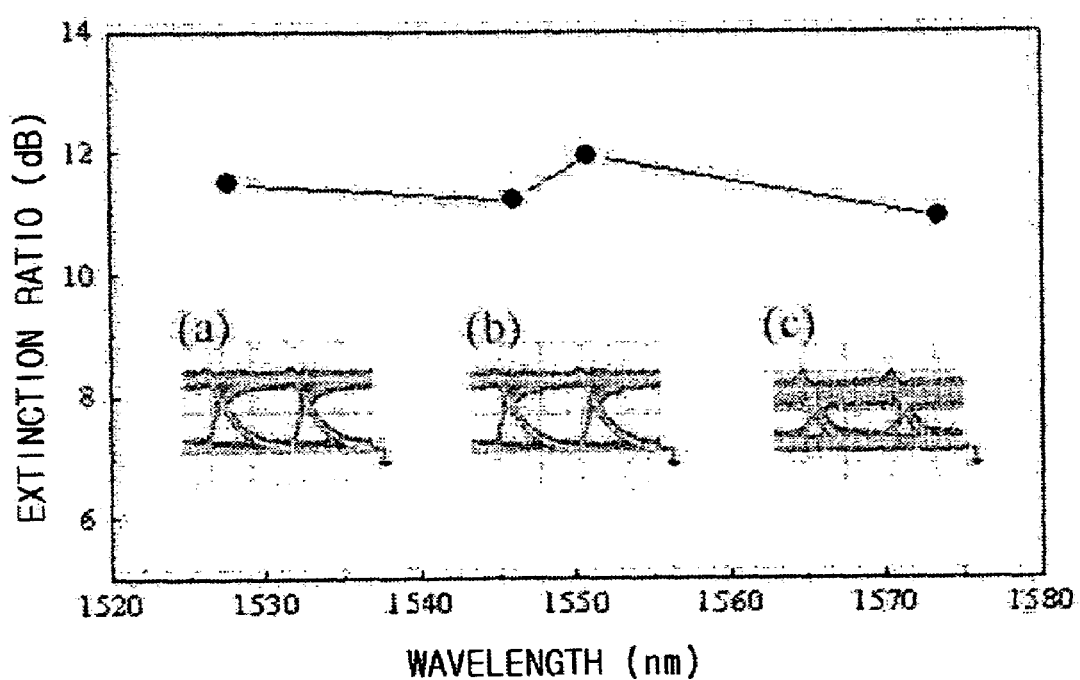
FIG. 6 shows the extinction ratio of an output optical signal when probe optical signals having different wavelenghts are input to the wavelength converter according to an embodiment of the present invention.

FIG. 6 shows the extinction ratio of an output optical signal when probe optical signals having different wavelenghts are input to the wavelength converter according to an embodiment of the present invention. Specifically, the wavelength of the pump optical signal is fixed to 1566.12 nm and the wavelength of the probe optical signal is changed to 1527.66 nm, 1546.07 nm, 1550.80 nm, and 1573.42 nm. Eye patterns shown in FIG. 6 represent eye patterns when optical wavelengths are 1527.66 nm (a), 1550.80 nm (b), and 1573.42 nm (c).

From FIG. 6, it can be known that the wavelength converter 100 of the present invention can output an optical signal having an extinction ratio of more than 10 dB over a band of approximately 50 nm.

As described above, the optical wavelength conversion apparatus and method using the injection locking of a Fabry-Perot laser diode according to the present invention can provide a wide wavelength conversion band, and easily carry out inverting and non-inverting wavelength conversion through the absorption null for the TM polarized probe optical signal and a variation in the center wavelength of the absorption null caused by the injection locking of the TE polarized pump optical signal.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An optical wavelength converter using injection locking of a Fabry-Perot laser diode, which converts the wavelength of an optical signal received from the outside, comprising:
   a first polarization controller that controls polarization of a pump optical signal to output a TE polarized pump optical signal;
   a second polarization controller that controls polarization of a probe optical signal to output a TM polarized probe optical signal;
   a photo-coupler that couples the TM polarized probe optical signal and TE polarized pump optical signal;
   a Fabry-Perot laser diode that injection-locks the TE polarized pump optical signal of the coupled signal to change the position of a TM mode absorption null (a point at which an output optical signal has a minimum intensity), to thereby convert the wavelength of the TE polarized pump optical signal to the wavelength of the TM polarized probe optical signal; and
   a circulator that outputs the probe optical signal to the outside.

2. The optical wavelength converter as claimed in claim 1, further comprising a third polarization controller that controls the polarization of the pump optical signal and the polarization of the probe optical signal such that they conform to TE and TM modes of the Fabry-Perot laser diode, respectively.

3. The optical wavelength converter as claimed in claim 2, wherein the Fabry-Perot laser diode includes a temperature controller that adjusts the surrounding temperature to control positions of the TE and TM modes.

4. The optical wavelength converter as claimed in claim 3, wherein the probe optical signal with the converted wavelength has the same wavelength interval as the wavelength interval recommended by organizations related with optical wavelength standards.

5. The optical wavelength converter as claimed in claim 2, wherein the photo-coupler includes a polarization beam splitter.

6. An optical wavelength conversion method using injection locking of a Fabry-Perot laser diode, which converts the wavelength of an optical signal received from the outside using a multi-mode Fabry-Perot laser diode, comprising:
   (a) controlling polarization of a probe optical signal to output a TM polarized probe optical signal;
   (b) controlling polarization of a pump optical signal to output a TE polarized pump optical signal;
   (c) coupling the TM polarized probe optical signal and TE polarized pump optical signal;
   (d) injection-locking the TE polarized pump optical signal of the coupled signal to change the position of a TM mode absorption null (a point at which an output optical signal has the minimum intensity), to thereby convert the wavelength of the TE polarized pump optical signal to the wavelength of the TM polarized probe optical signal; and
   (e) outputting the probe optical signal whose wavelength has been converted, to the outside.

7. The method as claimed in claim 6, further comprising (f) controlling the polarization of the pump optical signal and the polarization of the probe optical signal such that they conform to TE and TM modes of the Fabry-Perot laser diode, respectively.

8. The method as claimed in claim 7, wherein the step (c) includes controlling the surrounding temperature to locate the TM polarized probe optical signal at the TM mode absorption null, and injection-locking the TE polarized optical signal to change the wavelength of the TM polarized probe optical signal located at the absorption null.

* * * * *